United States Patent
Tang

(10) Patent No.: US 12,336,167 B2
(45) Date of Patent: Jun. 17, 2025

(54) MEMORY AND FORMING METHOD THEREOF

(71) Applicant: CHANGXIN MEMORY TECHNOLOGIES, INC., Hefei (CN)

(72) Inventor: Yi Tang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 520 days.

(21) Appl. No.: 17/817,143

(22) Filed: Aug. 3, 2022

(65) Prior Publication Data

US 2023/0422474 A1 Dec. 28, 2023

(30) Foreign Application Priority Data

Jun. 22, 2022 (CN) .......................... 202210710288.6

(51) Int. Cl.
*H10B 12/00* (2023.01)
(52) U.S. Cl.
CPC ............. *H10B 12/30* (2023.02); *H10B 12/03* (2023.02); *H10B 12/05* (2023.02); *H10B 12/482* (2023.02)
(58) Field of Classification Search
CPC ........ H10B 12/30; H10B 12/03; H10B 12/05; H10B 12/482; H10B 12/488; H10B 12/02; H10D 30/6755; H10D 86/423; H10D 86/481; H10D 86/60
See application file for complete search history.

(56) References Cited

U.S. PATENT DOCUMENTS

| | | | | |
|---|---|---|---|---|
| 11,335,687 B2* | 5/2022 | Lee | ......................... | H10B 12/30 |
| 11,417,659 B2* | 8/2022 | Son | ......................... | H10B 12/03 |
| 11,706,920 B2* | 7/2023 | Liu | ......................... | H10B 43/30 |
| | | | | 257/324 |
| 2020/0279601 A1* | 9/2020 | Kim | ..................... | G11C 11/4097 |
| 2021/0257366 A1* | 8/2021 | Lee | ......................... | H10B 12/50 |
| 2023/0389279 A1* | 11/2023 | Tang | ..................... | H10B 12/482 |

FOREIGN PATENT DOCUMENTS

CN 113284897 A 8/2021

* cited by examiner

*Primary Examiner* — Steven B Gauthier
*Assistant Examiner* — Khatib A Rahman
(74) *Attorney, Agent, or Firm* — Kilpatrick Townsend & Stockton LLP

(57) ABSTRACT

The present disclosure relates to a memory and a forming method thereof. The method of forming a memory includes: forming a stacked layer on a surface of a substrate, the stacked layer including interlayer isolation layers arranged at intervals in a first direction and a sacrificial layer group located between adjacent two of the interlayer isolation layers, the sacrificial layer group including a first sacrificial layer, a second sacrificial layer, and a third sacrificial layer sequentially stacked in the first direction, and the stacked layer including a transistor region, where the first direction is a direction perpendicular to a top surface of the substrate; removing the second sacrificial layer in the transistor region to form a first gap; and forming a gate layer and a channel layer wrapping the gate layer in the first gap.

10 Claims, 7 Drawing Sheets

MEMORY AND FORMING METHOD THEREOF

CROSS-REFERENCE TO RELATED APPLICATION

This application claims the priority of Chinese Patent Application No. 202210710288.6, submitted to the Chinese Intellectual Property Office on Jun. 22, 2022, the disclosure of which is incorporated herein in its entirety by reference.

TECHNICAL FIELD

The present disclosure relates to the technical field of semiconductor manufacturing, and in particular, to a memory and a forming method thereof.

BACKGROUND

As a semiconductor device commonly used in an electronic device such as a computer, a dynamic random access memory (DRAM) includes a plurality of memory cells, and each of the memory cells usually includes a transistor and a capacitor. The transistor has a gate being electrically connected to a word line, a source being electrically connected to a bit line, and a drain being electrically connected to the capacitor. A word line voltage on the word line can control on and off of the transistor, such that data information stored in the capacitor can be read through the bit line or data information can be written into the capacitor through the bit line.

Faster response speed, lower power consumption, and higher storage density are always the demand for a memory such as DRAM. As the size of a memory such as DRAM continues to shrink, the difficulty of a memory manufacturing process and the internal stress of the memory also continue to increase, thereby reducing the yield of the memory.

Therefore, how to simplify the memory manufacturing process and improve the memory yield is a technical problem to be solved urgently at present.

SUMMARY

According to some embodiments, the present disclosure provides a method of forming a memory, including:
  forming a stacked layer on a surface of a substrate, the stacked layer including interlayer isolation layers arranged at intervals in a first direction and a sacrificial layer group located between adjacent two of the interlayer isolation layers, the sacrificial layer group including a first sacrificial layer, a second sacrificial layer, and a third sacrificial layer sequentially stacked in the first direction, and the stacked layer including a transistor region, where the first direction is a direction perpendicular to a top surface of the substrate;
  removing the second sacrificial layers in the transistor region, and forming first gaps; and
  forming a gate layer and a channel layer wrapping the gate layer in each of the first gaps.

According to some other embodiments, the present disclosure further provides a memory, formed by using the method of forming a memory as stated above. The memory includes:
  a substrate; and
  a stacked structure, located on the substrate and including memory cells arranged at intervals in a first direction, where the first direction is a direction perpendicular to a top surface of the substrate;
  each of the memory cells includes a transistor and a capacitor located on a side of the transistor in a second direction; the transistor includes a gate layer, a channel layer wrapping the gate layer, and a drain electrode located at an end portion of the channel layer; the drain electrode is in contact and electric connection with the capacitor; and the second direction is a direction parallel to the top surface of the substrate.

DETAILED DESCRIPTION

Specific implementations of a memory and a forming method thereof provided in the present disclosure will be described below in detail with reference to the accompanying drawings.

Figures 1, 2:
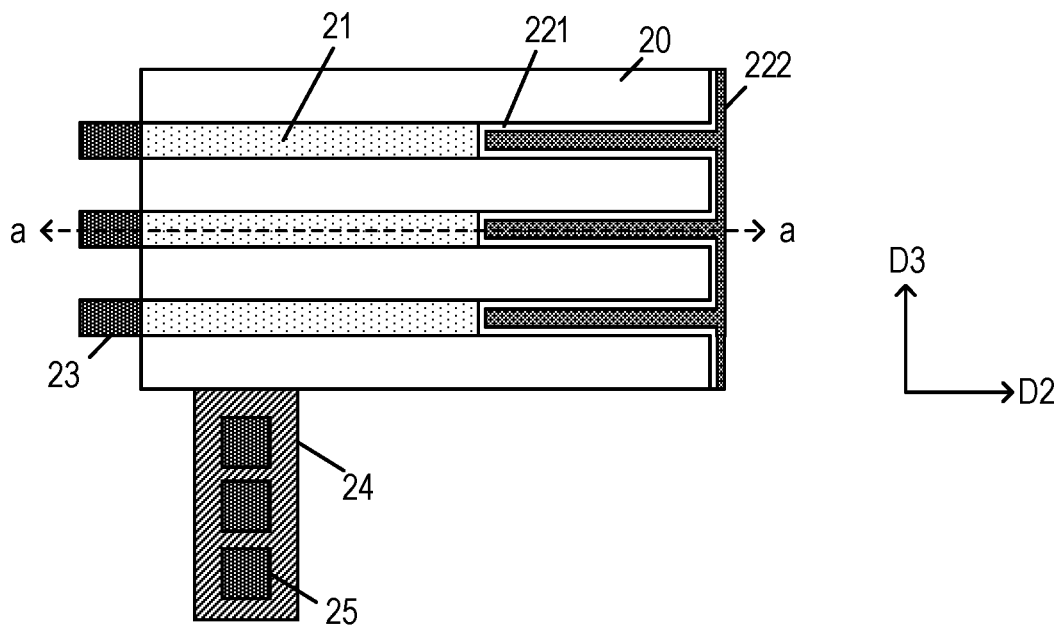
FIG. 1 is a flowchart of a method of forming a memory according to a specific implementation of the present disclosure.
FIG. 2 to FIG. 12 are schematic structural diagrams of main processes for forming a memory according to a specific implementation of the present disclosure.
Figure 3:
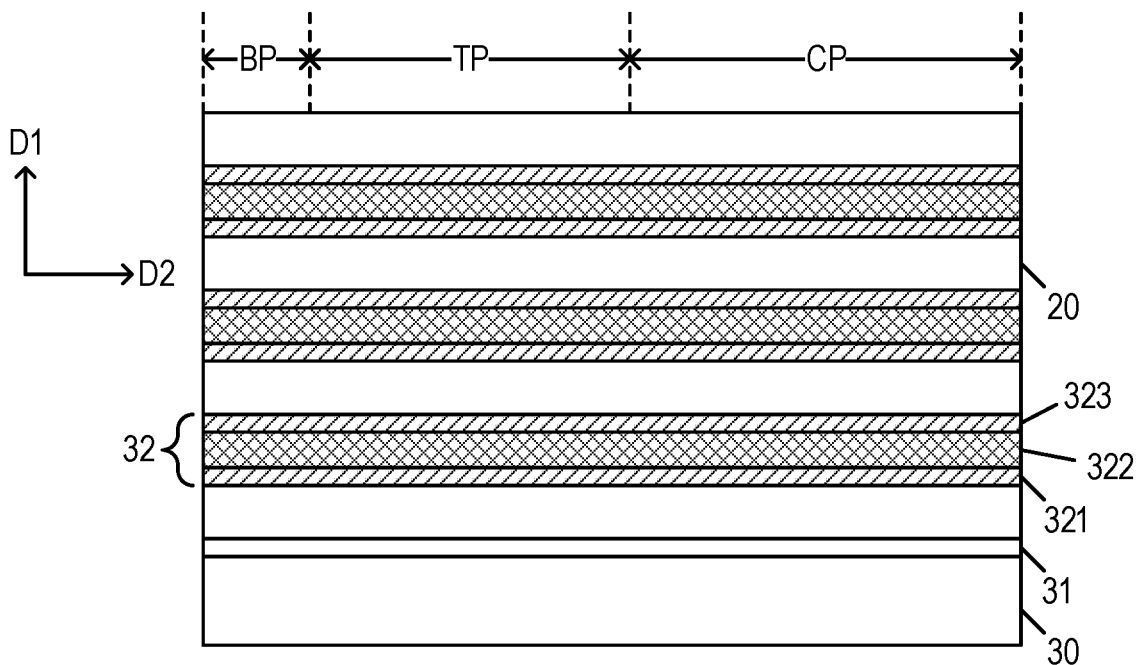

This specific implementation provides a method of forming a memory. FIG. 1 is a flowchart of a method of forming a memory according to a specific implementation of the present disclosure. FIG. 2 to FIG. 12 are schematic structural diagrams of main processes for forming a memory according to a specific implementation of the present disclosure. FIG. 2 is a top schematic structural diagram of a memory formed according to one embodiment in this implementation, FIG. 3 to FIG. 11 are schematic cross-sectional diagrams of a a-a position in FIG. 1 in a memory forming process according to this implementation, and FIG. 12 is a schematic structural diagram of a memory cell according to this implementation. As shown in FIG. 1 to FIG. 12, the method of forming a memory includes:

Step S11, form a stacked layer on a surface of a substrate 30, the stacked layer including interlayer isolation layers 20 arranged at intervals in a first direction D1 and a sacrificial layer group 32 located between adjacent two of the interlayer isolation layers 20, the sacrificial layer group 32 including a first sacrificial layer 321, a second sacrificial layer 322, and a third sacrificial layer 323 sequentially stacked in the first direction D1, and the stacked layer including a transistor region TP, where the first direction D1 is a direction perpendicular to a top surface of the substrate 30, as shown in FIG. 3.

Specifically, the substrate 30 may be, but not limited to, a silicon substrate. This specific implementation is described by using an example in which the substrate 30 is a silicon substrate. In other embodiments, the substrate 30 may alternatively be a semiconductor substrate such as a gallium nitride substrate, a gallium arsenide substrate, a gallium carbide substrate, a silicon carbide substrate or an SOI substrate. The substrate 30 is configured to support a device structure thereon. The top surface of the substrate refers to a surface of the substrate 30 towards the stacked layer.

In one example, the interlayer isolation layers 20, the first sacrificial layers 321, the second sacrificial layers 322, and the third sacrificial layers 323 may be alternately stacked on the top surface of the substrate 30 by using a chemical vapor deposition process, a physical vapor deposition process, or an atomic layer deposition process to form the interlayer isolation layers 20 and the sacrificial layer groups 32 alternately stacked in the first direction D1. The greater the number of the interlayer isolation layers 20 and the sacrificial layer groups 32 that are alternately deposited, the greater the storage capacity of the formed memory. The second sacrificial layer 322 is configured to subsequently form a channel layer and a gate layer. In one embodiment, the second sacrificial layer 322 has a height of 50-80 nm in the first direction D1.

In one embodiment, the interlayer isolation layer 20 is made of a nitride material (such as silicon nitride). The sacrificial layer group 32 is made of at least two different materials, thereby reducing the internal stress of the stacked layer and facilitating subsequent selective etching. The first sacrificial layer 321 and the third sacrificial layer 323 may be made of a same material. Both the first sacrificial layer 321 and the third sacrificial layer 323 should have a higher etching selection ratio to the second sacrificial layer 322, to facilitate subsequent selective etching. to reduce the memory manufacturing cost and simplify the memory manufacturing process, in one example, the first sacrificial layer 321 and the third sacrificial layer 323 are made of a same material, and the etching selection ratio between the first sacrificial layer 321 and the second sacrificial layer 322 should be greater than 3.

In some embodiments, the first sacrificial layer 321 and the third sacrificial layer 323 are each made of a low-dielectric-constant material, and the second sacrificial layer 322 is made of undoped polycrystalline silicon. The sacrificial layer group 32 is formed by using the low-dielectric-constant material and the undoped polycrystalline silicon, and the sacrificial layers 32 and the interlayer isolation layers 20 made of the nitride material (such as silicon nitride) are alternately stacked, such that the etching selection ratio between different material layers in the sacrificial layer group 32 can be further increased while further reducing the internal stress of the stacked layer. The low-dielectric-constant material refers to a material with a dielectric constant less than 3. For example, the low-dielectric-constant material may be, but not limited to, one or a combination of two or more of SiOH, SiOCH, FSG (fluorosilicate glass), BSG (borosilicate glass), PSG (phosphosilicate glass), and BPSG (borophosphosilicate glass).

In one embodiment, a substrate isolation layer 31 may also be provided between the substrate 30 and the stacked layer, to isolate the substrate 30 and the stacked layer, and further reduce the stress between the substrate 30 and the stacked layer. The substrate isolation layer 31 may be made of an insulating dielectric material such as oxide (such as silicon dioxide).

Step S12, remove the second sacrificial layers 322 in the transistor region TP, and form first gaps.

Figure 8:
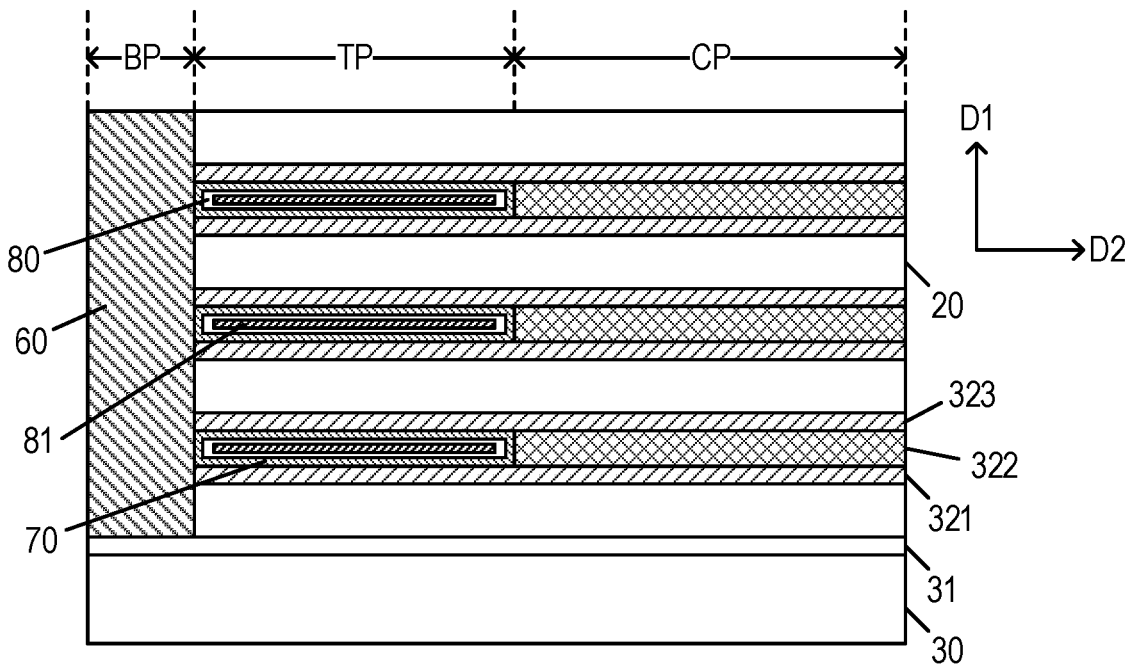

Step S13, form a gate layer 81 and a channel layer 70 wrapping the gate layer 81 in each of the first gaps, as shown in FIG. 8.

Figure 4:
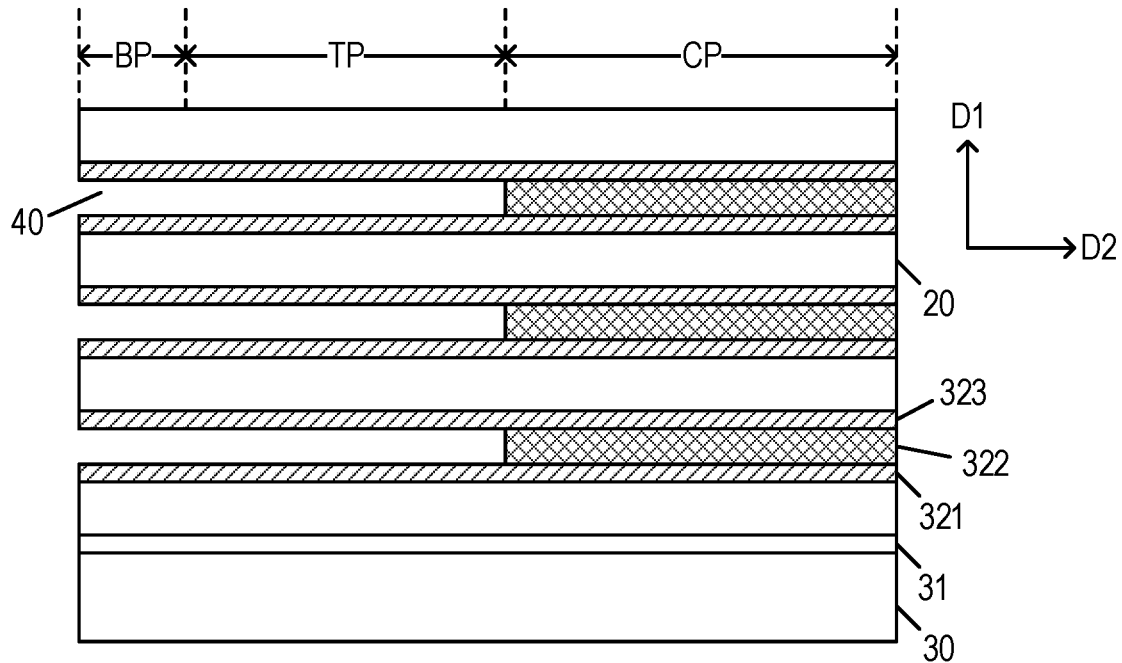
Figure 5:
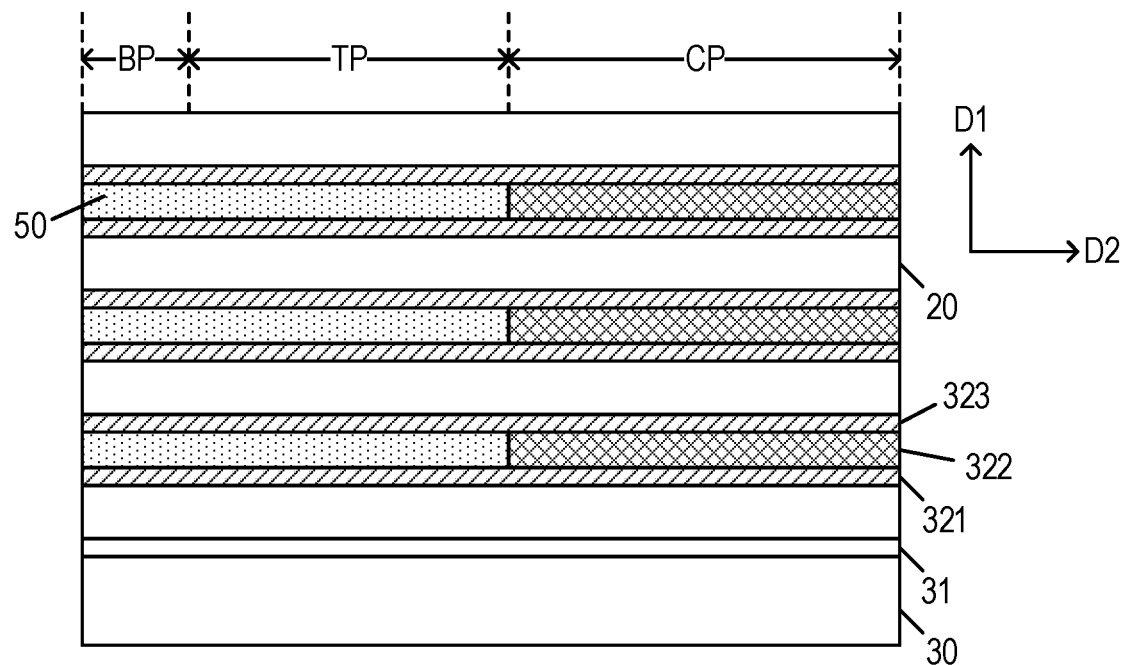
Figure 6:
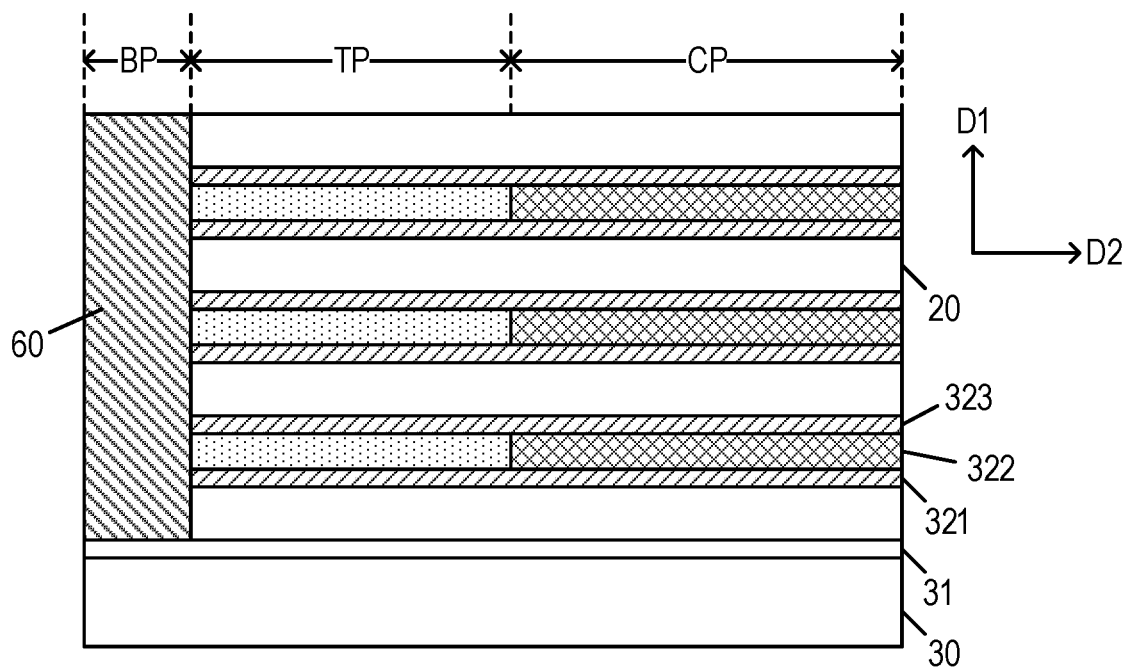

In some embodiments, the stacked layer further includes a bit line region BP located on a side of the transistor region TP in a second direction D2, and the second direction D2 is a direction parallel to the top surface of the substrate 30. The forming a first gap includes:

remove the second sacrificial layers 322 in the bit line region BP and the transistor region TP, and form first trenches 40, as shown in FIG. 4;

form a filling layer 50 filling up the first trenches 40, as shown in FIG. 5;

remove the filling layer 50, the first sacrificial layers 321, and the third sacrificial layers 323 in the bit line region BP, and form second trenches;

form a first isolation layer 60 filling up the second trenches, as shown in FIG. 6; and remove the filling layer in the transistor region TP, and form the first gaps.

To simplify a forming process of the first gaps, in some embodiments, the removing the second sacrificial layers 322 in the bit line region BP and the transistor region TP includes:

Specifically, the second sacrificial layers 322 in the bit line region BP and the transistor region TP may be removed by using a wet etching process, to form the first trenches 40, and each of the first trenches 40 is located between the first sacrificial layer 321 and the third sacrificial layer 323, as shown in FIG. 4. The first trenches 40 extend from the bit line region BP to the transistor region TP in the second direction D2. Thereafter, an insulating dielectric material such as an oxide (such as silicon dioxide) may be deposited in the first trenches 40 by using a lateral atomic layer deposition process, to form the filling layer 50 filling up the first trenches 40, as shown in FIG. 5. Next, the filling layer 50, the first sacrificial layers 321, and the third sacrificial layers 323 in the bit line region BP are removed by using a lateral etching process, to form the second trenches passing through the stacked layer in the first direction D1 in the bit line region BP. Thereafter, the insulating dielectric material such as a nitride (such as silicon nitride) is deposited in the second trenches, to form the first isolation layer 60 filling up the second trenches, as shown in FIG. 6. Thereafter, the filling layer in the transistor region TP is removed to form first gaps, and each of the first gaps is located between the first sacrificial layer 321 and the third sacrificial layer 323 in the transistor region TP.

The first isolation layer 60 is, on the one hand, configured to limit the position of the subsequently formed channel layer 70, and on the other hand, configured to support the stacked layer, preventing the stacked layer from tipping or collapsing in a subsequent process of forming a transistor. In one embodiment, the first isolation layer 60 and the interlayer isolation layers 20 may be made of a same material, to synchronously remove the first isolation layer 60 and the interlayer isolation layers 20 in a subsequent process of forming a bit line, thereby simplifying the bit line forming process.

Figure 7:
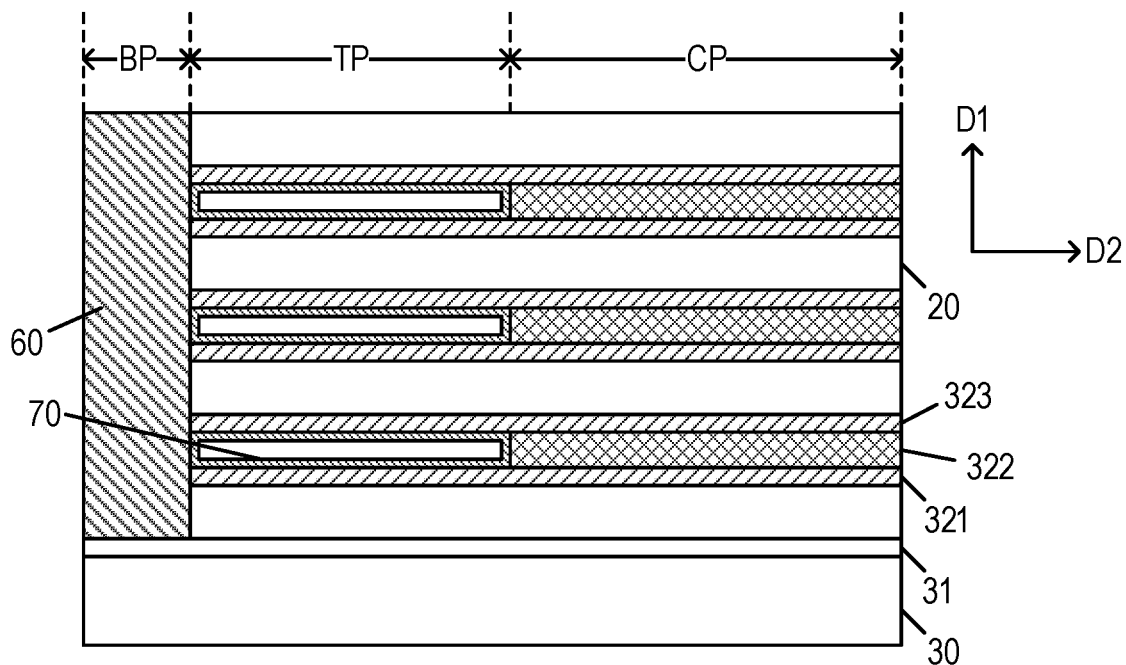

In some embodiments, the forming a gate layer 81 and a channel layer 70 wrapping the gate layer 81 in each of the first gaps includes:

form a channel layer 70 covering an inner wall of the first gap, as shown in FIG. 7;

form a gate dielectric layer 80 covering a surface of the channel layer 70 in each of the first gaps, as shown in FIG. 8; and form a gate layer 81 covering a surface of the gate dielectric layer 80 in each of the first gaps, as shown in FIG. 8.

Specifically, a channel material may be deposited in the first gap by using an atomic layer deposition process, a part of the channel material is removed through an etching-back process, and only the channel material covering the inner wall of the first gap is retained to form the channel layer 70, as shown in FIG. 7. In one embodiment, the channel layer 70 has a thickness of 20-40 nm, to reserve an enough space for subsequent formation of the gate layer 81, thereby reducing the difficulty of the process of subsequently forming the gate layer 81. Thereafter, a material with high dielectric constant is deposited on the surface of the channel layer 70 to form the gate dielectric layer 80. In one embodiment, the gate dielectric layer 80 has a thickness of 20-40 nm, to reserve an enough space for subsequent formation of the gate layer 81. The gate dielectric layer 80 may be made of one or a combination of two or more of $SiO_2$, HfO, and $Al_2O_3$. Thereafter, a gate material such as metal tungsten or TiN may be deposited on the surface of the gate dielectric layer 80 by using an atomic layer deposition process, to form the gate layer 81, as shown in FIG. 8.

In one embodiment, the stacked layer may further include a plurality of transistor regions TP arranged at intervals in a third direction D3 (referring to FIG. 2), and a transistor isolation layer 21 is also provided between adjacent two of the transistor regions TP for isolating adjacent two of the transistor regions TP. The forming a gate layer 81 covering a surface of the gate dielectric layer 80 in each of the first gaps may include: deposit a gate electrode in the first gaps to form a plurality of word lines 24 extending in the third direction D3 and continuously covering a plurality of transistor regions, where the word lines 24 located in the transistor regions are used as the gate layers 81. The ends of the word lines 24 extend out of the transistor region in the third direction D3 to be electrically connected to the word line plugs 25. The plurality of word lines 24 are arranged at intervals in the first direction D1, and the ends of the plurality of word lines 24 extending out of the transistor region in the third direction D3 form a stepped structure, to lead out signals of the plurality of word lines 24. The stepped structure refers to any adjacent two of the word lines 24 in the first direction D1, and one of the word lines 24 closer to the substrate 30 in the third direction D3 protrudes from the other of the word lines 24. In this specific implementation, "a plurality of" means two or more.

In some embodiments, the channel layer 70 is made of an oxide semiconductor material. The metal oxide material may be transformed between a conductor and an insulator, and using the metal oxide material to form the channel layer 70 does not require a complex doping process, thereby simplifying the memory forming process. The metal oxide material is any one or a combination of two or more of $In_2O_3$ (indium oxide), ZnO (zinc oxide), IZO (indium zinc oxide), IGZO (indium gallium zinc oxide), IZTO (indium tin zinc oxide), and ZnON (zinc oxynitride).

In some embodiments, after the gate layer 81 and the channel layer 70 wrapping the gate layer 81 are formed in each of the first gaps, the method of forming a memory further includes:

remove the first isolation layer 60 and the interlayer isolation layers 20 in the bit line region BP, and form second gaps exposing first end portions of the channel layers 70; and form, in each of the second gaps, a source electrode 90 covering the first end portion of the channel layer 70 and a bit line 23 extending in the first direction D1, the bit line 23 continuously covering surfaces of source electrodes 90 arranged at intervals in the first direction D1.

For example, the first isolation layer 60 and the interlayer isolation layers 20 in the bit line region BP may be removed by using a wet etching process or a dry etching process, to form the second gaps exposing the first end portions of the channel layers 70. Then, a bit line material (such as tungsten, TiN, or other conductive materials) may be deposited in the second gaps by using an atomic layer deposition process, to form the source electrodes 90, each of the source electrodes 90 covering the first end portion of the corresponding channel layer, and synchronously form the bit lines 23 extending in the first direction D1. The bit lines 23 each continuously cover the surfaces of the source electrodes 90 arranged at intervals in the first direction D1, and the plurality of bit lines 23 are arranged at intervals in the third direction D3. To simplify the etching process, only the interlayer isolation layer 20 and the first isolation layer 60 in the bit line region BP are removed. Therefore, the source electrode 90 only covers the side surface of the channel layer 70, such that the projection of the channel layer 70 on the top surface of the substrate 30 is in directly contact with but does not overlap with the projection of the source electrode 90 on the top surface of the substrate 30. In addition, the bit line 23 and the source electrode 90 are synchronously formed by once deposition process. Therefore, there is no contact interface between the bit line 23 and the source electrode 90, such that the contact resistance between the bit line 23 and the source electrode 90 can be reduced or even avoided to further improve the electric performance of the memory.

Figure 9:
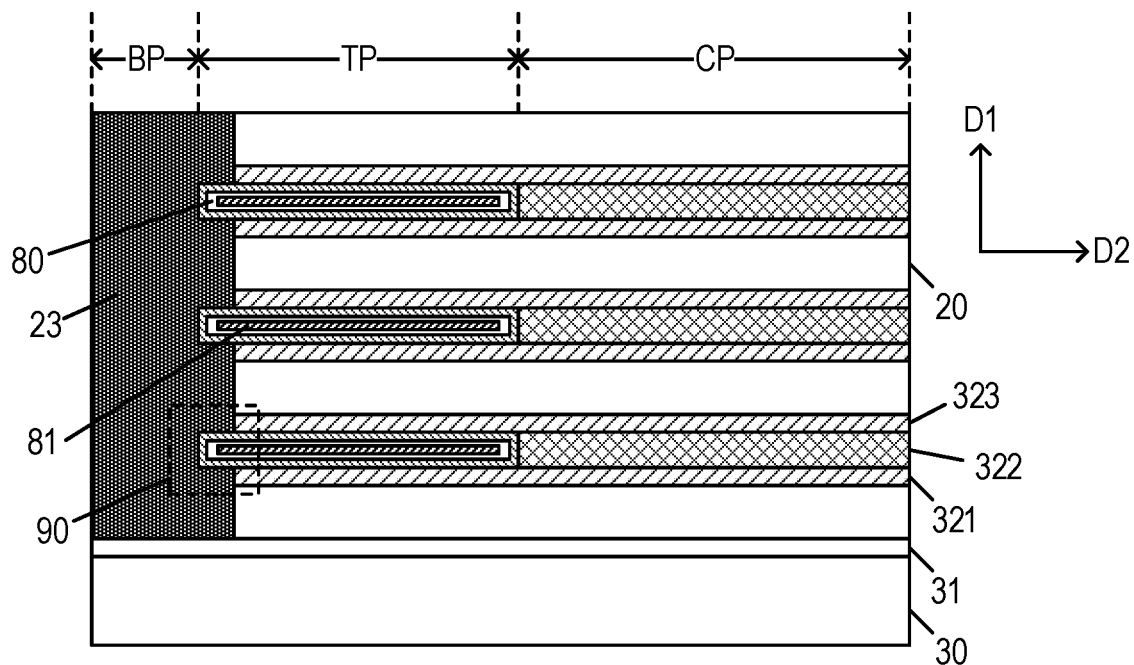

In some other embodiments, after the gate layer 81 and the channel layer 70 wrapping the gate layer 81 are formed in each of the first gaps, the method of forming a memory further includes:

remove the first isolation layer 60 and the interlayer isolation layers 20 in the bit line region BP, and remove a part of each of the first sacrificial layers 321, a part of each of the third sacrificial layers 323, and a part of each of the interlayer isolation layers 20 in the transistor region TP to form second gaps exposing the channel layers 70; and form, in each of the second gaps, a source electrode 90 covering the first end portion of the channel layer 70, and a bit line 23 extending in the first direction D1, the bit line 23 continuously covering surfaces of source electrodes 90 arranged at intervals in the first direction D1, as shown in FIG. 9 and FIG. 12.

For example, the first isolation layer 60 and the interlayer isolation layers 20 in the bit line region BP may be removed by using a wet etching process or a dry etching process, and a part of each of the first sacrificial layers 321, a part of each of the third sacrificial layers 323, and a part of each of the interlayer isolation layers 20 in the transistor region TP are removed to form the second gaps exposing the channel layers 70. Then, the bit line material (such as tungsten, TiN, or other conductive materials) may be deposited in the second gaps by using an atomic layer deposition process, to form the source electrodes 90, each of the source electrodes 90 covering the first end portion of the corresponding channel layer, and synchronously form the bit lines 23 extending in the first direction D1. The bit lines 23 each continuously cover the surfaces of the source electrodes 90 arranged at intervals in the first direction D1, and the plurality of bit lines 23 are arranged at intervals in the third direction D3. Both the bit line region BP and the transistor region TP are etched in the etching process. Therefore, the source electrode 90 coats the first end portion of the channel layer 70 (that is, the source electrode 90 coats the side surface, a part of the bottom surface, and a part of the top surface of the channel layer), such that the projection of the channel layer 70 on the top surface of the substrate 30 overlaps with the projection of the source electrode 90 on the top surface of the substrate 30, thereby reducing the size of the memory. In addition, the bit line 23 and the source electrode 90 are synchronously formed by once deposition process. Therefore, there is no contact interface between the bit line 23 and the source electrode 90, such that the contact resistance between the bit line 23 and the source electrode 90 can be reduced or even avoided to further improve the electric performance of the memory.

Figure 10:
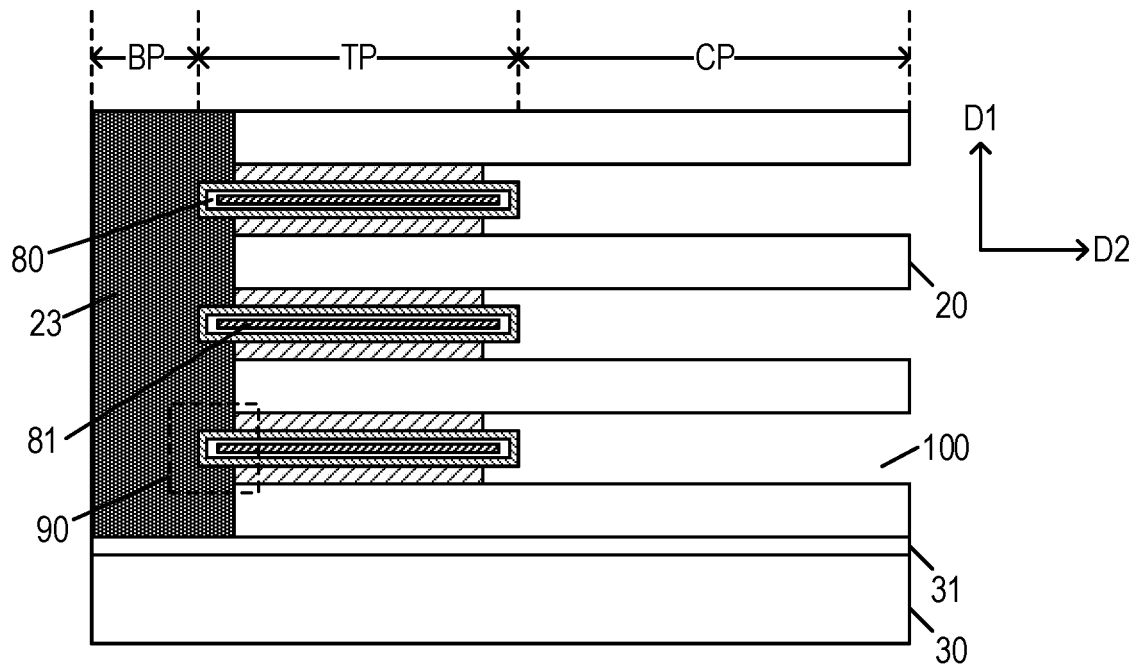

In some embodiments, the stacked layer further includes a capacitor region CP, and the capacitor region CP and the bit line region BP are arranged on two opposite sides of the transistor region TP in the second direction D2. After the gate layer 81 and the channel layer 70 wrapping the gate layer 81 are formed in each of the first gaps, the method of forming a memory further includes:

remove the sacrificial layer groups 32 in the capacitor region CP, and form third gaps 100 exposing second end portions of the channel layers 70, as shown in FIG. 10, the second end portion and the first end portion being oppositely distributed in the second direction D2; and form, in each of the third gaps, a drain electrode 111 covering the second end portion of the channel layer 70, and a capacitor in contact and electric connection with the drain electrode 111.

For example, after the third gaps are formed, a bottom electrode material (such as tungsten, TiN, or other conductive materials) is deposited in the third gaps, to form the drain electrodes 111, each of the drain electrodes 111 covering the second end portion of the corresponding channel layer 70, and synchronously form a bottom electrode layer 110 in contact and electric connection with the drain electrodes 111. Thereafter, a dielectric layer 221 covering the surface of the bottom electrode layer 110 and a top electrode layer 222 covering the surface of the dielectric layer 221 are formed, thereby forming the capacitor including the bottom electrode layer 110, the dielectric layer 221, and the top electrode layer 222. To simplify the etching process, only the sacrificial layer groups 32 in the capacitor region CP is removed. Therefore, each of the drain electrodes 111 only covers the side surface of the corresponding channel layer 70, such that the projection of the channel layer 70 on the top surface of the substrate 30 is in directly contact with but does not overlap with the projection of the drain electrode 111 on the top surface of the substrate 30. In addition, the bottom electrode layer 110 and the drain electrodes 111 are synchronously formed by once deposition process. Therefore, there is no contact interface between the bottom electrode layer 110 and the drain electrodes 111, such that the contact resistance between the bottom electrode layer 110 and the drain electrodes 111 can be reduced or even avoided to further improve the electric performance of the memory.

Figure 11:
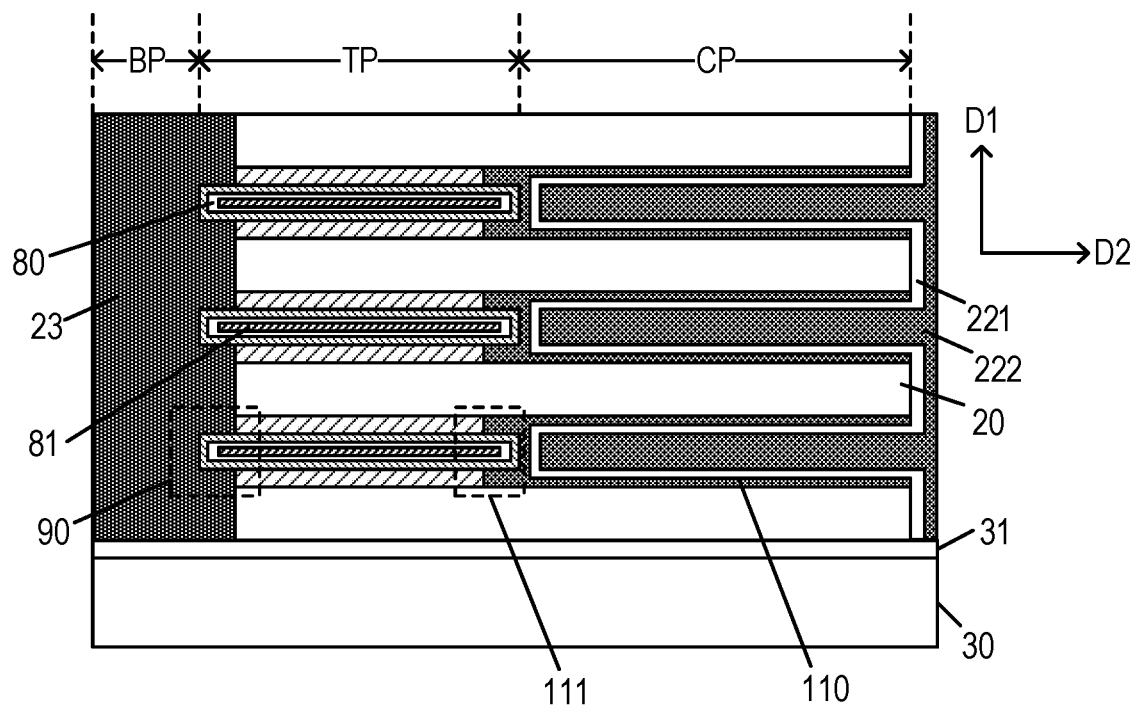
Figure 12:
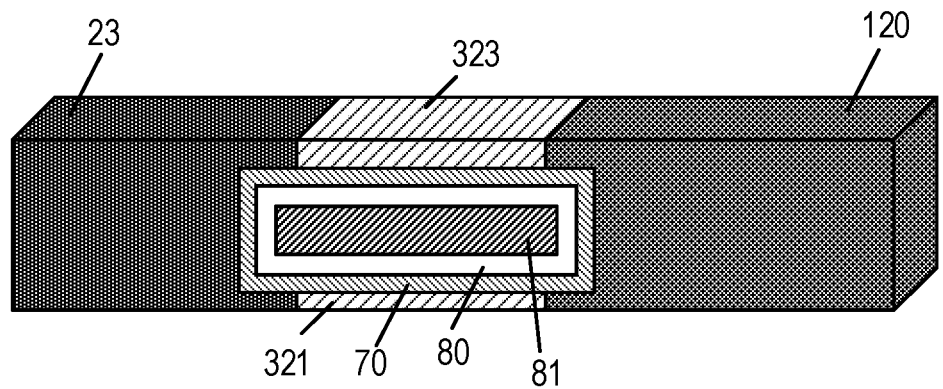

In some other embodiments, the stacked layer further includes a capacitor region CP, and the capacitor region CP and the bit line region BP are arranged on two opposite sides of the transistor region TP in the second direction D2. After the gate layer 81 and the channel layer 70 wrapping the gate layer 81 are formed in each of the first gaps, the method of forming a memory further includes:

remove the sacrificial layer groups 32 in the capacitor region CP, and remove a part of each of the first sacrificial layers 321 and a part of each of the third sacrificial layers 323 in the transistor region TP, and form third gaps exposing a second end portions of the channel layers 70, the second end portion and the first end portion being oppositely distributed in the second direction D2; and form, in each of the third gaps, a drain electrode 111 covering the second end portion of the channel layer 70 and a capacitor in contact and electric connection with the drain electrode 111, as shown in FIG. 11 and FIG. 12.

For example, after the third gaps are formed, a bottom electrode material (such as tungsten, TiN, or other conductive materials) is deposited in the third gaps, to form the drain electrodes 111, each of the drain electrodes 111 covering the second end portion of the corresponding channel layer 70, and synchronously form a bottom electrode layer 110 in contact and electric connection with the drain electrodes 111. Thereafter, a dielectric layer 221 covering the surface of the bottom electrode layer 110 and a top electrode layer 222 covering the surface of the dielectric layer 221 are formed, thereby forming the capacitor including the bottom electrode layer 110, the dielectric layer 221, and the top electrode layer 222. Both the capacitor region CP and the transistor region TP are etched in the etching process. Therefore, each of the drain electrodes 111 coats the second end portion of the corresponding channel layer 70 (that is, the drain electrode 111 covers the side surface, a part of the bottom surface, and a part of the top surface of the channel layer 70), such that the projection of the channel layer 70 on the top surface of the substrate 30 partially overlaps with the projection of the drain electrode 111 on the top surface of the substrate 30, thereby reducing the size of the memory. In addition, the bottom electrode layer 110 and the drain electrodes 111 are synchronously formed by once deposition process. Therefore, there is no contact interface between the bottom electrode layer 110 and the drain electrodes 111, such that the contact resistance between the bottom electrode layer 110 and the drain electrodes 111 can be reduced or even avoided to further improve the electric performance of the memory.

In another embodiment, all of the first sacrificial layers 321 and the third sacrificial layers 323 in the transistor region TP may synchronously be removed while removing the sacrificial layer groups 32 in the capacitor region CP. Thereafter, the drain electrodes 111 covering the second end portions of the channel layers 70 and the capacitor in contact and electric connection with the drain electrodes 111 are formed in the third gaps, and an air gap is formed between the drain electrode 111 and the source electrode 90, thereby further reducing the internal resistance of the memory.

Figure 13:
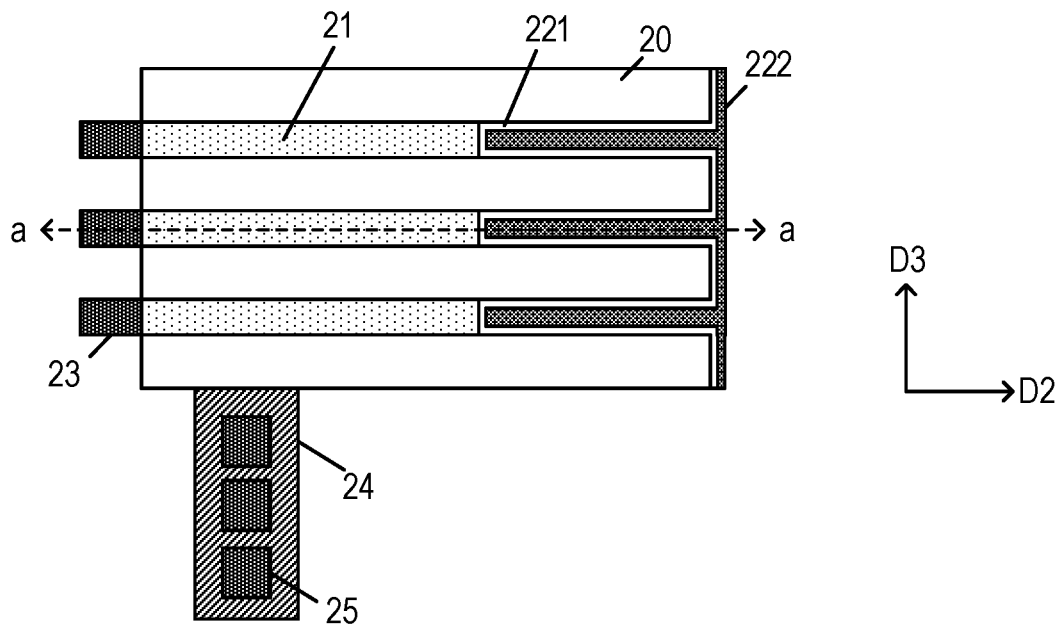
FIG. 13 and FIG. 14 are schematic structural diagrams of a memory according to a specific implementation of the present disclosure.
Figure 14:
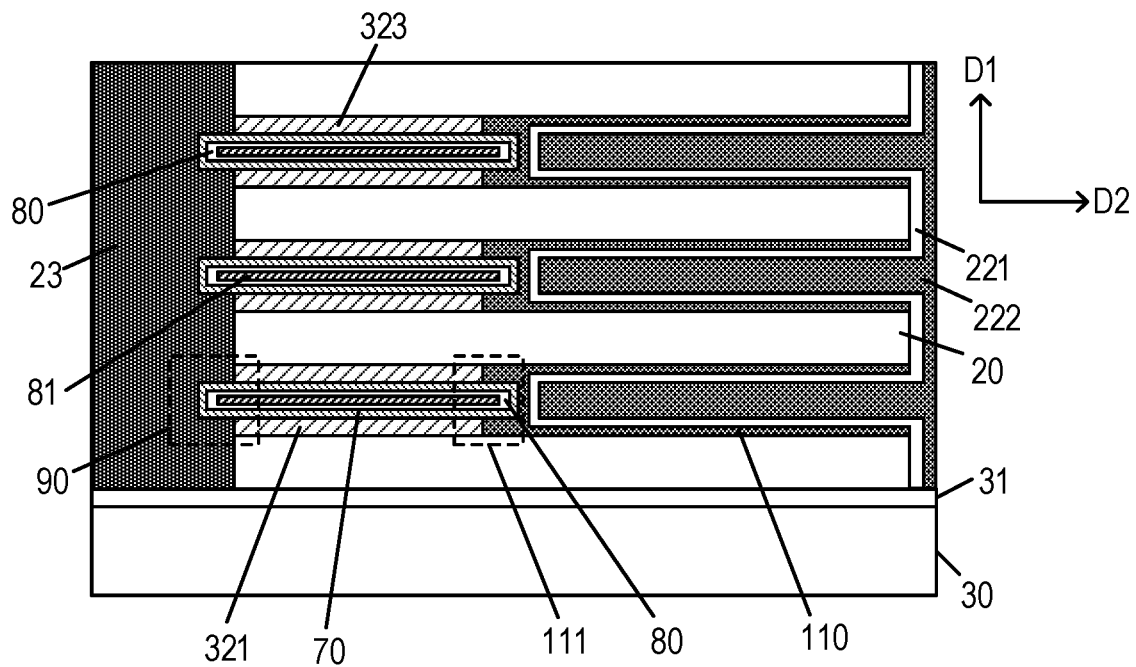

This specific implementation further provides a memory. FIG. 13 and FIG. 14 are schematic structural diagrams of a memory according to a specific implementation of the present disclosure. FIG. 13 is a top schematic structural diagram of a memory according to this implementation, and FIG. 14 is a schematic cross-sectional diagram of a a-a position in FIG. 13. The memory provided in this specific implementation may be formed by using the method of forming a memory shown in FIG. 1 to FIG. 12. As shown in FIG. 13 and FIG. 14, the memory includes:

a substrate 30; and a stacked structure located on a top surface of the substrate 30 and including memory cells arranged at intervals in a first direction D1, where the first direction D1 is a direction perpendicular to the top surface of the substrate 30;

each of the memory cells includes a transistor and a capacitor located on a side of the transistor in a second direction D2; the transistor includes a gate layer 81, a channel layer 70 wrapping the gate layer 81, and a drain electrode 111 located at an end portion of the channel layer 70; the drain electrode 111 is in contact and electric connection with the capacitor; and the second direction D2 is a direction parallel to the top surface of the substrate 30.

In some embodiments, the channel layer 70 includes a first end portion and a second end portion oppositely distributed in the second direction D2, the drain electrode 111 is located at the second end portion of the channel layer 70, and projection of the drain electrode 111 on the top surface of the substrate 30 partially overlaps with projection of the channel layer 70 on the top surface of the substrate 30.

In some embodiments, the channel layer 70 includes a first end portion and a second end portion oppositely distributed in the second direction D2, the drain electrode 111 is located at the second end portion of the channel layer 70, and projection of the drain electrode 111 on the top surface of the substrate 30 is in contact with but does not overlap with projection of the channel layer 70 on the top surface of the substrate 30.

In some embodiments, the channel layer 70 includes a first end portion and a second end portion oppositely distributed in a second direction D2, the drain electrode 111 is located at the second end portion of the channel layer 70, and the second direction D2 is a direction parallel to the top surface of the substrate 30. The transistor further includes:

a source electrode 90 located at the first end portion of the channel layer 70, projection of the source electrode 90 on the top surface of the substrate 30 partially overlapping with projection of the channel layer 70 on the top surface of the substrate 30.

In some embodiments, the channel layer 70 includes a first end portion and a second end portion oppositely distributed in a second direction, the drain electrode 111 is located at the second end portion of the channel layer 70, and the second direction D2 is a direction parallel to the top surface of the substrate 30. The transistor further includes:

a source electrode 90 located at the first end portion of the channel layer 70, where projection of the source electrode 90 on the top surface of the substrate 30 is in contact with but does not overlap with projection of the channel layer 70 on the top surface of the substrate 30.

According to the memory and the method of forming a memory provided by this specific implementation, the stacked layer in which the interlayer isolation layers and the sacrificial layer group are alternately stacked is first formed on the top surface of the substrate, and then the second sacrificial layer in the sacrificial layer group is replaced with the gate layer and the channel layer wrapping the gate layer. On the one hand, by forming the sacrificial layer group including the first sacrificial layer, the second sacrificial layer, and the third sacrificial layer, the internal stress of the stacked layer can be reduced, thereby being helpful to increase the stacking height of the stacked layer and the storage capacity of the memory to improve the yield and performance of the memory; and on the other hand, the channel layer and the gate layer are formed by replacing the sacrificial layers, such that the formation of transistor in the memory does not require a complex epitaxial growth and doping process, and the yield of the memory can be further improved while simplifying the memory manufacturing process. In addition, by combining a memory cell 1T1C (one transistor and one capacitor) according to some embodiments of the present disclosure with a channel-all-around (CAA) structure, the integration level of the memory can be increased, and the yield of the memory can be further improved.

The above described are merely preferred implementations of the present disclosure. It should be noted that several improvements and modifications may further be made by a person of ordinary skill in the art without departing from the principle of the present disclosure, and such improvements and modifications should also be deemed as falling within the protection scope of the present disclosure.

The invention claimed is:

1. A method of forming a memory, comprising:

forming a stacked layer on a surface of a substrate, the stacked layer comprising interlayer isolation layers arranged at intervals in a first direction and a sacrificial layer group located between adjacent two of the interlayer isolation layers, the sacrificial layer group comprising a first sacrificial layer, a second sacrificial layer, and a third sacrificial layer sequentially stacked in the first direction, and the stacked layer comprising a transistor region, wherein the first direction is a direction perpendicular to a top surface of the substrate;

removing the second sacrificial layers in the transistor region, and forming first gaps; and forming a gate layer and a channel layer wrapping the gate layer in each of the first gaps.

2. The method of forming a memory according to claim 1, wherein the first sacrificial layer and the third sacrificial layer are each made of a low-dielectric-constant material, and the second sacrificial layer is made of undoped polycrystalline silicon.

3. The method of forming a memory according to claim 1, wherein the stacked layer further comprises a bit line region located on a side of the transistor region in a second direction, and the second direction is a direction parallel to the top surface of the substrate; and the forming first gaps comprises:

removing the second sacrificial layers in the bit line region and the transistor region, and forming first trenches;

forming a filling layer filling up the first trenches;

removing the filling layer, the first sacrificial layers, and the third sacrificial layers in the bit line region, and forming second trenches;

forming a first isolation layer filling up the second trenches; and removing the filling layer in the transistor region, and forming the first gaps.

4. The method of forming a memory according to claim 3, wherein the removing the filling layer, the first sacrificial layers, and the third sacrificial layers in the bit line region, and forming second trenches comprises:

removing the filling layer, the first sacrificial layers, and the third sacrificial layers in the bit line region by using a lateral etching process.

5. The method of forming a memory according to claim 1, wherein the forming a gate layer and a channel layer wrapping the gate layer in each of the first gaps comprises:

forming a channel layer covering an inner wall of the first gap;

forming a gate dielectric layer covering a surface of the channel layer in each of the first gaps; and forming a gate layer covering a surface of the gate dielectric layer in each of the first gaps.

6. The method of forming a memory according to claim 3, after the gate layer and the channel layer wrapping the gate layer are formed in each of the first gaps, the method further comprises:

removing the first isolation layer and the interlayer isolation layers in the bit line region, and forming second gaps exposing first end portions of the channel layers; and forming, in each of the second gaps, a source electrode covering the first end portion of the channel layer, and a bit line extending in the first direction, the bit line continuously covering surfaces of source electrodes arranged at intervals in the first direction.

7. The method of forming a memory according to claim 6, after the gate layer and the channel layer wrapping the gate layer are formed in each of the first gaps, the method further comprises:

removing the first isolation layer and the interlayer isolation layers in the bit line region, and removing a part of each of the first sacrificial layers, a part of each of the third sacrificial layers, and a part of each of the interlayer isolation layers in the transistor region, and forming second gaps exposing the channel layers; and forming, in each of the second gaps, a source electrode covering the first end portion of the channel layer, and a bit line extending in the first direction, the bit line continuously covering surfaces of source electrodes arranged at intervals in the first direction.

8. The method of forming a memory according to claim 6, wherein the stacked layer further comprises a capacitor region, and the capacitor region and the bit line region are arranged on two opposite sides of the transistor region in the second direction; and after the gate layer and the channel layer wrapping the gate layer are formed in each of the first gaps, the method further comprises:

removing the sacrificial layer groups in the capacitor region, and forming third gaps exposing second end portions of the channel layers, the second end portion and the first end portion being oppositely distributed in the second direction; and forming, in each of the third gaps, a drain electrode covering the second end portion of the channel layer, and a capacitor in contact and electric connection with the drain electrode.

9. The method of forming a memory according to claim 6, wherein the stacked layer further comprises a capacitor region, and the capacitor region and the bit line region are arranged on two opposite sides of the transistor region in the second direction; and after the gate layer and the channel layer wrapping the gate layer are formed in each of the first gaps, the method further comprises:

removing the sacrificial layer groups in the capacitor region, and removing a part of each of the first sacrificial layers and a part of each of the third sacrificial layers in the transistor region, and forming third gaps exposing second end portions of the channel layers, the second end portion and the first end portion being oppositely distributed in the second direction; and forming, in each of the third gaps, a drain electrode covering the second end portion of the channel layer, and a capacitor in contact and electric connection with the drain electrode.

10. The method of forming a memory according to claim 1, wherein the channel layer is made of an oxide semiconductor material.

* * * * *